United States Patent [19]
Hettiger

[11] Patent Number: 4,584,544
[45] Date of Patent: Apr. 22, 1986

[54] BANDSWITCHED INTERSTAGE COUPLING NETWORK INCLUDING A HIGH SIDE COUPLED CAPACITOR

[75] Inventor: James Hettiger, Marion County, Ind.

[73] Assignee: RCA Corporation, Princeton, N.J.

[21] Appl. No.: 705,497

[22] Filed: Feb. 28, 1985

[51] Int. Cl.⁴ .............................................. H03H 7/01
[52] U.S. Cl. ................... 333/174; 333/24 R; 333/175
[58] Field of Search ........................ 333/167, 174–180, 333/171, 24 R; 334/47, 56, 57, 59, 60, 15; 358/21 R, 167, 196; 455/191, 199

[56] References Cited
U.S. PATENT DOCUMENTS
3,049,682 8/1962 Waring ................................. 333/174

OTHER PUBLICATIONS
FIG. 18 of RCA Color Television Basic Service Data for the CTC 121 Series, published by RCA Corporation in 1982.

Primary Examiner—Marvin L. Nussbaum
Attorney, Agent, or Firm—Eugene M. Whitacre; Peter M. Emanuel; Lawrence C. Edelman

[57] ABSTRACT

An interstage coupling network is provided comprising a series connection of an even number of reactive elements coupled between the input and output terminals of the interstage network, a junction point of said series connection of inductors being coupled to a signal reference potential via a first reactive shunt element. A series connection of oppositely-poled switching diodes is coupled in parallel with a portion of said series connection of reactive elements, the junction between the series-coupled diodes being coupled to the signal reference potential via a second reactive shunt element. A third reactive element is coupled between the network output terminal and a point on the series connection of reactive elements which is remote from the input terminal of the network.

18 Claims, 8 Drawing Figures

BANDSWITCHED INTERSTAGE COUPLING NETWORK INCLUDING A HIGH SIDE COUPLED CAPACITOR

FIELD OF THE INVENTION

This invention relates to an interstage coupling network including switched reactive elements so as to pass signals in two different frequency bands, and in particular, to the connection of a passband shaping circuit to the interstage coupling network which is effective in both frequency bands and which does not require any bandswitched elements.

BACKGROUND OF THE INVENTION

Interstage coupling networks couple signal from the output of one stage to the input of another stage and usually include frequency selective tunable circuits for selecting the pass band of the coupled signal. Interstage coupling networks are typically included in the tuner portion of a television receiver for selecting the signals which are passed from an RF signal amplifying stage to a heterodyning mixer stage. The interstage coupling network includes tunable elements which are adjusted in response to the selected television channel for passing the proper frequency range of the received RF signals to the mixer so that the selected television signals can be processed for ultimately presenting a video and audio program to a viewer. In general, television receivers must be able to select a particular RF signal for a specified channel out of several different frequency ranges, or bands, of broadcast television signals. By way of example, in the United States, the television tuner must be capable of selecting channels for which the RF picture carrier frequency may be in the low-VHF, high-VHF or the UHF tuning band.

Continuous tuning of an interstage coupling network from the low-VHF through to the UHF frequency band is generally not possible of the great frequency range which must be covered. Therefore, television tuner interstage coupling networks typically include switching provisions for selecting different reactive elements for inclusion therein, depending on the frequency band of the selected channel. FIG. 1a illustrates a prior art tunable interstage coupling network suitable for use in a multiband television tuner. A tunable interstage coupling network 10 couples RF signals from a signal source 12 to a load circuit 14. Source 12 may comprise the output of an FET RF amplifying stage, represented by a current source $i_s$ coupled in parallel with an impedance $R_p$, which receives television RF signals from an antenna (not shown) and supplies the full range of received RF signals to an input terminal 16 of network 10. Load circuit 14 may comprise the input impedance of a heterodyning mixer circuit and is represented by a resistor $R_L$ which receives the selected RF signals from output terminal 18 of network 10. Network 10 includes a primary inductor 20 having one end coupled to input terminal 16 and a secondary inductor 22 having one end coupled to output terminal 18. The other ends of inductors 20 and 22, respectively, are coupled to the anodes of series-connected, oppositely-poled diodes 24 and 26. The junction of diodes 24 and 26 is coupled to a point of reference potential, such as signal ground, via a series connection of a mutual inductor 28 and a first source of switching signal $V_{s1}$. A series connection of two further inductors 30 and 32 is coupled in parallel with series-connected diodes 24 and 26. The junction between inductors 30 and 32 is also coupled to signal ground, via a mutual inductor 34 and a second source of switching signal $V_{s2}$. Variable capacitance tuning elements 36 and 38 are coupled to terminals 16 and 18, respectively, and concurrently controlled (as indicated by the dashed lines) for tuning the RF signal passband of coupling network 10 within the frequency band selected by the polarity of switching signals $V_{s1}$ and $V_{s2}$.

For receiving RF signals in a first tuning band, switching signal source $V_{s1}$ provides a high positive voltage to the cathodes of diodes 24 and 26 while source $V_{s2}$ provides signal ground to their anodes. This biases diodes 24 and 26 into conduction and results in a configuration for interstage coupling network 10 as illustrated in FIG. 1(b). In that figure, the forward resistance of the diodes and the equivalent inductance of their signal leads are small enough to be insignificant and therefore are not shown. A coupling network of this type is generally said to have "low-side L" inductive mutual coupling, due to the fact that the coupling between inductors 20 and 22 is substantially determined by an inductor 28, which is coupled from the junction of inductors 20 and 22 to the low side of network 10, i.e., signal ground. As is readily apparent, as the frequency of interest is increased, the impedance of inductor 28 increases, allowing for a greater coupling of signals from the primary side (input) to the secondary side (output) of network 10.

Tracking tunable elements 36 and 38 can tune a passband of e.g., 10 MHz, from the low end to the high end of the selected frequency band. The desired tuning is shown in FIG. 2 for passbands tuned at the low ($f_1$), middle ($f_2$) and high ($f_3$) portions of the selected frequency band. Note that it is desirable that the bandwidth of the RF signal passband be relatively constant across the selected frequency band and that frequencies above the $f_3$ passband be sharply attenuated. In a television receiver, frequencies just above the selected tuning band may include image frequencies, which, if not substantially attenuated, can undesirably effect the quality of the reproduced picture and/or sound. Coupling network 10 exhibits a passband bandwidth variation which varies across the selected band in accordance with the cube of the frequency ($f^3$). It is herein recognized as desirable to compensate for this bandwidth variation by using what is generally referred to as "top-side C" capacitive coupling which comprises adding a coupling capacitor $C_c$ such as shown in FIG. 1(b), between terminals 16 and 18. As generally known to those skilled in the design of interstage coupling networks, capacitor $C_c$ reduces passband bandwidth variations to approximately 2:1 across the selected frequency band and additionally forms a resonant trap circuit with the "low-side L" inductor 28 of network 10 for attenuating the image frequency signals which are just above the upper end of the selected frequency band. This effect can intuitively be understood once it is realized that low side L coupling has a positive coefficient of coupling and top side C coupling has a negative coefficient of coupling. Therefore the top side C coupling tends to cancel the low side inductive coupling, thereby substantially compensating for the passband bandwidth variations caused by the low side inductive coupling and forms a trap circuit at the frequency wherein their coupling is equal but opposite. For the sake of simplicity, the resultant 2:1 passband variation is not shown in FIG. 2, however, the effect of the image trap is clearly indicated for signal frequencies equal to or greater than the upper end of the f₃ passband.

For receiving RF signals in a second tuning band of, e.g., a lower frequency range than the first tuning band, switch signal source $V_{s1}$ provides a low voltage to the anodes of diodes 24 and 26 while switch source $V_{s2}$ provides a high positive potential to their cathodes. This biases diodes 24 and 26 out of conduction and results in a configuration for network 10 as illustrated in Figure 1(c). Thus, inductors 30 and 32 become part of the series connection of inductors between input and output terminals 16 and 18. Low side L inductive coupling is provided in this configuration by an inductor 34 coupled from the junction of inductors 30 and 32 to signal ground via the second source of switching signal $V_{s2}$. It is herein recognized as desirable to also include top side C coupling in this configuration of network 10. Due to the lower frequency of the second tuning band, the capacitance value of a top-side C coupling capacitor $C_c'$ must be greater than the capacitance value of $C_c$ of FIG. 1(b), in order to provide an image trap for frequencies just above the high end of the second tuning band. If $C_c$ were used in the FIG. 1(c) configuration, its capacitance value would be too low for the lower frequency tuning band of the second configuration, and the image trap would undesirably occur at a higher frequency within the tuning range of the second tuning band.

In order to provide both $C_c$ and $C_c'$ in coupling network 10 of FIG. 1(a), it would seem appropriate to simply include them in a passband shaping network connected between terminals 16 and 18 which includes a series connection of a second capacitor and a switching diode in parallel with $C_c$ such that when the diode is conductive, the parallel combination of the second capacitor with $C_c$ would equal $C_c'$. However, it is undesirable to include a switching diode in the top-side C coupling circuit of FIG. 1(a) due to its increased cost and added circuit complexity. Perhaps more importantly, the signal frequency of the first and second bands may be relatively high and the parasitic reactance of the switching diode may adversely effect the equivalent top-side C coupling circuit and a proper value for $C_c'$ may not be attainable. Thus, it would be desirable to connect a coupling capacitor to network 10 such that the passband bandwidth variation is minimized and the location of the image frequency trap remains at a useful position just above the upper end of each selectable frequency band.

SUMMARY OF THE INVENTION

In accordance with the principles of the invention an interstage coupling network comprises a series connection of an even number of reactive elements coupled between the input and output terminals of the interstage network, a junction point of the series connection of reactive elements being coupled to a signal reference potential via a first reactive shunt element. A series connection of oppositely-poled switching diodes is coupled in parallel with a portion of the series connection of reactive elements, the junction between the series-coupled diodes being coupled to the signal reference potential via a second reactive shunt element. A third reactive element is coupled between the network output terminal and a point on the series connection of reactive elements which is between the input terminal of the network and the junction of the series connection of diodes with the series connection of reactive elements.

DETAILED DESCRIPTION OF THE INVENTION

Figure 1A:
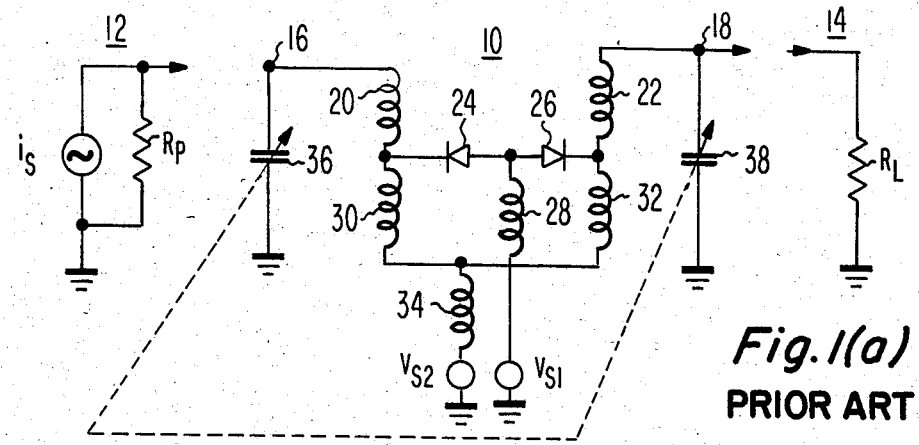
FIGS. 1(a), 1(b) and 1(c) previously described, illustrative in schematic diagram form prior art tunable interstage coupling networks.
Figure 1B:
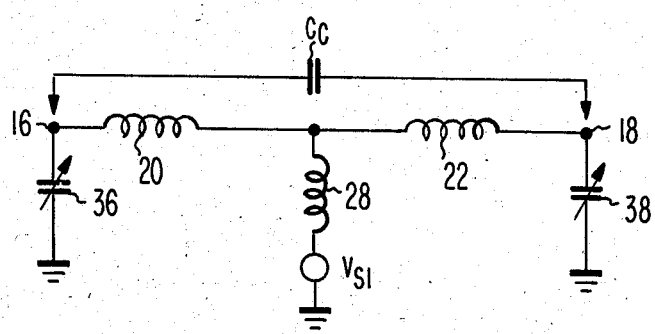
Figure 1C:
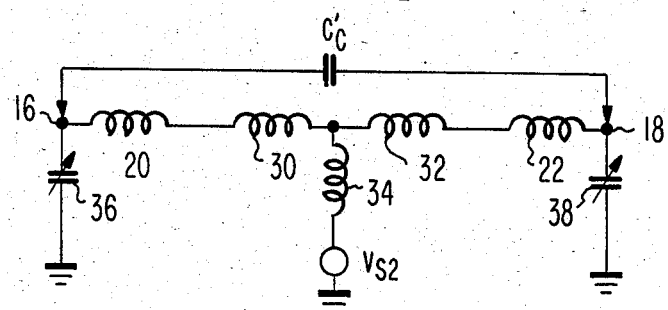
Figure 2:
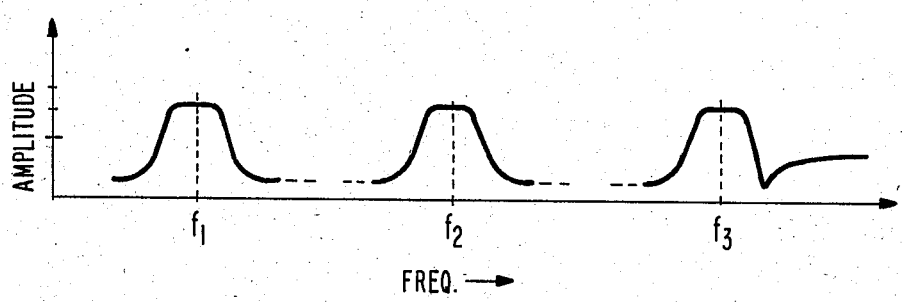
FIG. 2 illustrates the desired tunable passband response for the interstage coupling network of FIGS. 1(a)–1(c)
Figure 3A:
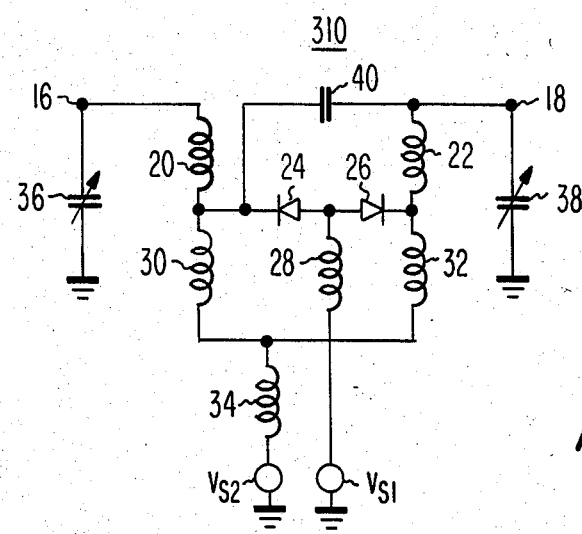
FIGS. 3(a), 3(b) and 3(c) illustrate in schematic diagram form an interstage coupling network in accordance with the present invention.

FIG. 3(a) illustrates a tunable interstage coupling network 310 substantially similar to network 10 of FIG. 1(a) except for the connection of a top-side C coupling capacitor 40. In FIG. 3(a) elements having the same function as those described with respect to FIGS. 1 are similarly numbered and their connection and operation will not be further described. In network 310 a single top-side coupling capacitor 40 is coupled between the junction of inductor 20 and bandswitching diode 24 and the output terminal 18. The manner in which capacitor 40 can be effective in two different frequency selective bands will be described with respect to FIGS. 3b and 3c, which correspond to the configuration of network 310 for a first and a second, lower, frequency band, such as previously described with respect to FIGS. 1(b) and 1(c) except that in FIG. 3(b), $L_{eq}$ and R represent the equivalent inductance and resistance of each of bandswitching diodes 24 and 26.

Illustratively, the first tuning band may comprise television RF signal frequencies between 271 MHz and 463 MHz (corresponding to TV channels in what is called the superband and hyperband cable television bands) and the second tuning band may comprise television RF signal frequencies between 157 MHz and 265 MHz (corresponding to TV channels in the upper portion of the midband cable television band and in the high VHF broadcast band).

Figure 3B:
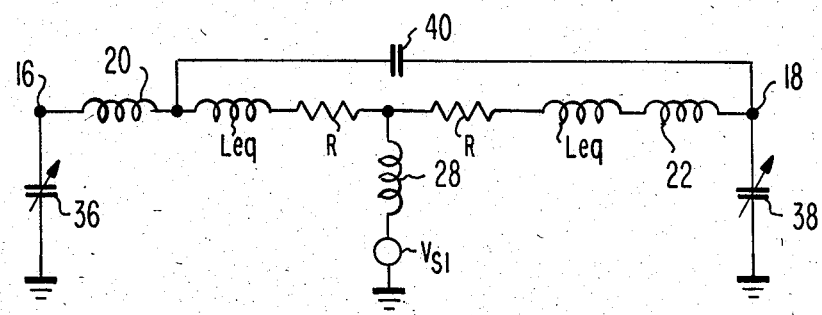

As previously noted, when the interstage coupling network is configured to tune the higher frequency range band, if the value of the top-side C is not changed from what it was for the lower frequency range band, it would be of a value which is too large. This would result in too much coupling of signal from input terminal 16 to output terminal 18 and would therefore not effectively control bandwidth variations, and could result in an image trap which has a resonant frequency which would fall within the passband of the higher frequency range configuration of the interstage coupling network. However, connection of capacitor 40 in accordance with the present invention prevents these undesirable results. As shown in FIG. 3(b), capacitor 40 receives signal from the junction of inductor 20 and the equivalent inductance $L_{eq}$ of diode 24. In a preferred embodiment of a television tuner coupling network to be described with respect to FIG. 4, inductor 20 has a value of about 20 nH while $L_{eq}$ has a value of about 4 nH. Thus, capacitor 40 receives signal which is substantially attenuated due to the inductive voltage divider action caused by the conduction of diode 24. This action advantageously reduces the amount of signal which is coupled by capacitor 40 to output terminal 18 (which amount of coupled signal would otherwise be too great, since the value of capacitor 40 is too high for the first frequency band) thereby delaying until a greater frequency the point at which the top side coupling cancels the low side coupling, and consequently shifting the resonant frequency to a point just above the first tuning band.

Figure 3C:
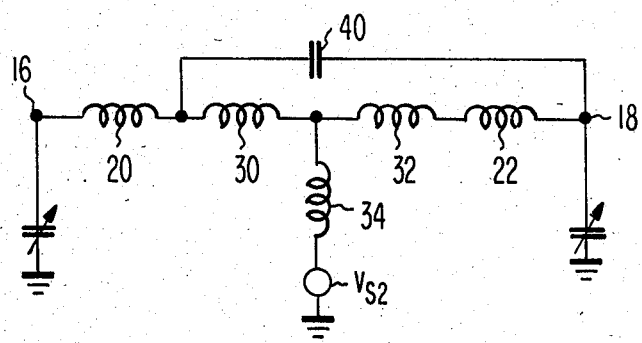

Referring to FIG. 3(c), in a preferred television tuner embodiment, the value of the total inductance for the series string of inductors between input and output terminals 16 and 18 may be selected such that the value of inductors 30 and 32 is at least twice as large as the value of inductors 20 and 22, respectively. In the preferred embodiment, the values of inductors 20 and 22 are approximately 20 nanohenries (nH) and inductors 30 and 32 are approximately 60 nH. Inductor 34 is approximately 10 nH. A value of 0.56 pico Farads (pF) for capacitor 40 has been found to be effective in a band-switched television tuner interstage coupling network for controlling the passband bandwidth variation to within approximately a 2:1 variation over the entire frequency range of the second tuning band and which established an image frequency trap just above the highest frequency in the band. Since inductor 20 is of a value significantly less than the value of inductor 30, the coupling of one end of capacitor 40 to the junction between inductors 20 and 30 has relatively little effect on the proper operation of capacitor 40 with respect to passband shaping.

Thus what has been shown is the advantageous use of coupling one end the top side C capacitor to a point common to both circuit configurations, yet near the connection point of the switching diode 24 to inductor 20 which effectively forms a voltage divider when diode 24 conducts, thereby reducing the coupling provided by the top side C capacitor and raising the resonant frequency of the image signal trap.

Figure 4:
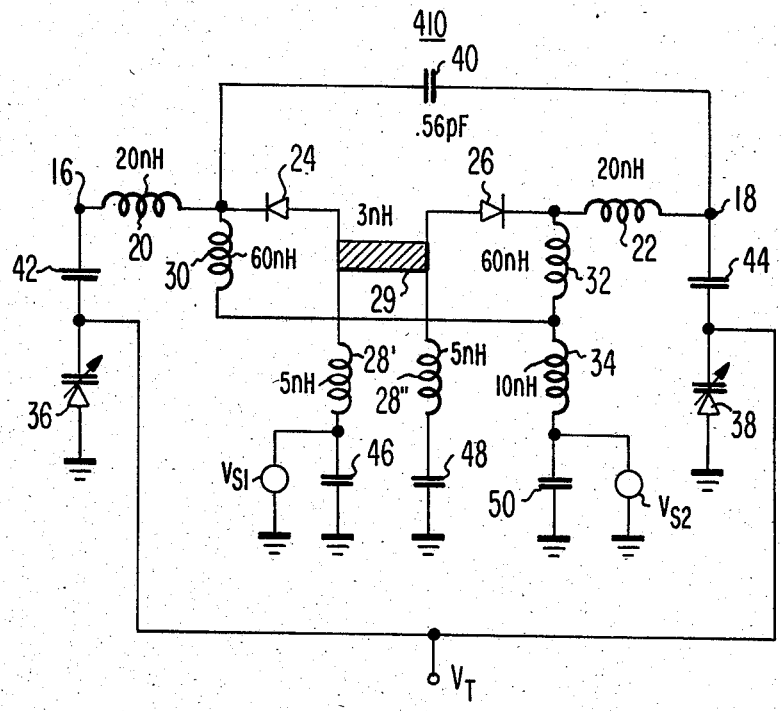
FIG. 4 illustrates in schematic diagram form a preferred embodiment of a tunable interstage coupling network in accordance with the present invention suitable for use in a television receiver.

FIG. 4 illustrates in schematic diagram form a preferred embodiment 410 of the interstage coupling network 310 of FIG. 3(a). In network 410 tunable capacitors 36 and 38 are illustrated as comprising variable capacitance diodes which receive the television tuning voltage $V_t$ for controlling their capacitance value. $V_t$ typically can vary from 2-25 V for causing diodes 36 and 38 to have a capacitance variation from approximately 1-20 pF so as to tune from one end of the selected frequency band to the other end. DC voltage blocking capacitors 42 and 44 prevent the tuning voltage from interfering with the operation of bandswitching diodes 24 and 26. Furthermore, in accordance with a further aspect of the invention, inductor 28 of FIG. 3(a) is replaced by a "$\pi$" network comprising inductors 28' and 28", having first ends which are coupled to signal ground by coupling capacitors 46 and 48, respectively, and second ends which are coupled together by a printed circuit board foil strip 29. A coupling capacitor 50 couples one end of inductor 34 to signal ground. The $\pi$ network is advantageous in that it allows a greater freedom in picking component values for the inductors of the interstage coupling network which are (1) of a convenient value with respect to the selected tuning band and (2) which enable a relatively good impedance match to the adjoining input and output stages. For example, suppose network 410 was required to match different impedances at input terminal 16 and output terminal 18. In this case, the ratio of the inductance of inductor 20 to that of inductor 28' can be selected independently of the ratio of inductances for inductor 22 to that of inductor 28", since foil 29, which corresponds to about 3 nH, adds a finite impedance between inductors 28' and 28".

Although the interstage coupling network has been described for use in a television receiver tuner, it is apparent that interstage coupling networks are equally effective in any application wherein multiband signals must be handled. Furthermore, although in the preferred embodiment, a specific arrangement of inductive and capacitive reactive elements is illustrated, it is apparent that a different arrangement and/or additional reactive components can also be used without departing from the scope of the invention.

What is claimed is:

1. A tunable interstage coupling network comprising:
   an input terminal for receiving signal and an output terminal for supplying signal;
   first and second variable capacitance elements coupled to said input and output terminals, respectively, for causing said network to tune within a selected frequency range;
   a series connection of more than two inductors coupled between said input and output terminals, a junction between two of said inductors being coupled to a signal reference potential via a shunt inductor;
   switch means coupled in series with first and second inductors of said series connection which each have one end most closely coupled to said input and output terminal, respectively, and in parallel with the remaining ones of the series connected inductors, selective conduction of said switching means causing said network to assume a first configuration which effectively eliminates said remaining ones of said inductors from said network such that it is tunable by said variable capacitance elements in a first selected frequency range, and selective nonconduction of said switching means causing said network to assume a second configuration which is tunable in a second selected frequency range; and
   a capacitor having one end coupled to the junction of said switch means with said series connection of inductors and the other end coupled to one of said input and output terminals.

2. The network according to claim 1, wherein said series connection of inductors includes first, second, third and fourth inductors coupled in the named order and said shunt inductor is coupled between the junction of said second and third inductors and said signal reference potential.

3. The network according to claim 2, wherein the inductance value of said first and fourth inductors is at least half the inductance value of said second and third inductors.

4. The network according to claim 2, wherein said switching means comprises series-coupled, oppositely-poled, switching diodes connected in series with said first and fourth inductors and in parallel with said second and third inductors.

5. The network according to claim 4, wherein said capacitor is coupled between the junction of said first and second inductors and said output terminal.

6. The network according to claim 5, wherein the equivalent inductance of said switching diodes when conductive is less than the inductance of said first and fourth inductors.

7. The network according to claim 6, wherein said first configuration is for passing signals in a first RF television signal band and said second configuration is for passing RF television signals in a second RF television signal band having a frequency range lower than the frequency range of said first television signal band.

8. A tunable interstage coupling network comprising:
an input terminal for receiving signal and an output terminal for supplying signal;
first and second variable capacitance tuning elements, one end of said first and second tuning elements being coupled to said input terminal and said output terminal, respectively, and the other ends being coupled to a signal reference potential;
first and second inductors, one end of said first and second inductors being coupled to said input and said output terminals, respectively;
series-coupled, oppositely-poled switching diodes coupled between the other ends of said first and second inductors, the junction of said switching diodes being coupled to a first source of switch potential via a third inductor;
fourth and fifth series-coupled inductors also coupled between the other ends of said first and second inductors, the junction between said fourth and fifth inductors being coupled to a second source of switch potential via a sixth inductor; and
a capacitor coupled between said input and output terminals, such that it is coupled in series with said first inductor and in parallel with said second inductor.

9. The network according to claim 8, wherein said capacitor has one end coupled to the junction of said first inductor and said switching diode and the other end coupled to the network output terminal.

10. The network according to claim 9, wherein the inductance of said fourth and fifth inductors is at least twice as large as the inductance of said first and second inductors.

11. The network according to claim 10, wherein said series-coupled, oppositely-poled switching diodes have an equivalent inductance when conductive which is equal to or less than the inductance of said first and second inductors.

12. An interstage coupling network comprising:
an input terminal for receiving signal and an output terminal for supplying signal;
a series connection of an even number greater than two of reactive elements coupled between said input terminal and said output terminal, the midpoint junction of said series connection of reactive elements being coupled to a first signal reference potential via a first reactive shunt element;
a series connection of oppositely-poled switching diodes in parallel with a portion of said series connection of reactive components which are centered about said midpoint junction, the junction of said series-connected diodes being coupled to a second signal reference potential via a second reactive shunt element; and
a third reactive element coupled between said output terminal and a point on said series connection of reactive elements which is between said input terminal and a junction of said switching diodes with said series connection of reactive elements.

13. The network according to claim 12, wherein said series and shunt elements each comprise reactive inductors and said third reactive element comprises a capacitor.

14. The network according to claim 13, wherein said series connection of reactive elements comprises first, second, third and fourth inductors coupled in series in the named order between said input terminal and said output terminal and said midpoint junction is situated between said second and third inductors.

15. The network according to claim 14, wherein said series-coupled switching diodes are coupled in parallel with said second and third inductors so as to bypass these inductors when conductive, such that said network is operable to tune within a frequency range which is of a higher frequency than when said oppositely-poled switching diodes are not conductive.

16. The network according to claim 14, wherein said third reactive element is coupled in series with said first named inductor and in parallel with said fourth named inductor.

17. The network according to claim 16, wherein said third reactive element comprises a capacitor.

18. The network according to claim 17, wherein said capacitor is coupled between the junction of said first and second inductors and said output terminal.

* * * * *

UNITED STATES PATENT AND TRADEMARK OFFICE
CERTIFICATE OF CORRECTION

PATENT NO. : 4,584,544

DATED : April 22, 1986

INVENTOR(S) : James Hettiger

It is certified that error appears in the above-identified patent and that said Letters Patent is hereby corrected as shown below:

Claim 12, Column 8, line 10, after "diodes", insert -- coupled --.

Signed and Sealed this

Thirteenth Day of January, 1987

Attest:

DONALD J. QUIGG

Attesting Officer

Commissioner of Patents and Trademarks